United States Patent
Lederer

(10) Patent No.: US 8,182,273 B2
(45) Date of Patent: May 22, 2012

(54) POWER SEMICONDUCTOR MODULE WITH PRESTRESSED AUXILIARY CONTACT SPRING

(75) Inventor: Marco Lederer, Nuernberg (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 69 days.

(21) Appl. No.: 12/622,244

(22) Filed: Nov. 19, 2009

(65) Prior Publication Data

US 2010/0130035 A1     May 27, 2010

(30) Foreign Application Priority Data

Nov. 19, 2008 (DE) .......................... 10 2008 057 832

(51) Int. Cl.
*H01R 12/00* (2006.01)
*H05K 1/00* (2006.01)
(52) U.S. Cl. ......................................................... 439/81
(58) Field of Classification Search ................. 439/81, 439/74, 66, 73, 840
See application file for complete search history.

(56) References Cited

U.S. PATENT DOCUMENTS

| | | | |
|---|---|---|---|
| 5,438,479 A | 8/1995 | Heilbronner | |
| 6,979,204 B2 * | 12/2005 | Gobl et al. | 439/73 |
| 7,187,074 B2 | 3/2007 | Uchiyama et al. | |
| 2008/0217756 A1 | 9/2008 | Boettcher et al. | |

FOREIGN PATENT DOCUMENTS

| | | |
|---|---|---|
| DE | 42 37 632 | 5/1994 |
| DE | 197 19 703 | 11/1998 |
| DE | 10 2004 025 609 | 12/2005 |
| DE | 10 2005 024 900 | 1/2006 |
| DE | 10 2006 006 421 | 8/2007 |
| DE | 10 2006 058 692 | 6/2008 |
| DE | 10 2007 010 883 | 9/2008 |
| EP | 1 933 380 * | 6/2008 |

OTHER PUBLICATIONS

Examination Report dated Apr. 2, 2010 issued in corresponding German Patent Application No. 10 2008 057 832.0.

* cited by examiner

*Primary Examiner* — Javaid Nasri
(74) *Attorney, Agent, or Firm* — Roger S. Thompson

(57) ABSTRACT

A power semiconductor module having a housing, a pressure member, a substrate including at least one contact surface, and at least one connection element leading towards the exterior of the housing. The connection element has a first contact device, a resilient section and a second contact device. The pressure member has two stop elements. The first contact device is electrically conductively connected to the contact surfaces of the substrate. The second contact device is arcuate in shape and has at least one deformation at the beginning and at the end of the arc, wherein, as a result of the deformations of the second contact device co-operating with the two stop elements of the pressure member, the connection element is prestressed.

3 Claims, 4 Drawing Sheets

POWER SEMICONDUCTOR MODULE WITH PRESTRESSED AUXILIARY CONTACT SPRING

BACKGROUND OF THE INVENTION

1. Field of the Invention

The invention is directed to power semiconductor modules and, more particularly, to power semiconductor modules having a contact spring providing pressure contact to ensure electrical connection of the elements thereof.

2. Description of the Related Art

Know power semiconductor modules of the type described herein are described, example from German Published Patent Application DE 197 19 703 A1. Power semiconductor modules of this type comprise, according to the prior art, a housing with at least one electrically insulating substrate arranged therein, preferably for direct mounting on a cooling component. The substrate, for its part, comprises a body made up of an insulating material with a plurality of mutually insulated metallic connecting tracks situated thereon and power semiconductor components which are situated on the connecting tracks and connected to the connecting tracks in a circuit-conforming manner. Furthermore, such known power semiconductor modules have external connection elements for external load and auxiliary connections and also internal connecting elements. These internal connecting elements for circuit-conforming connections in the power semiconductor module are usually embodied as wire bonding connections.

Likewise known are pressure-contact-connected power semiconductor modules, such as are shown in German Published Patent Application DE 42 37 632 A1. In modules such as discussed in that document, the pressure device has a stable, preferably metallic, pressure element for building up pressure, an elastic cushion element for storing pressure, and a bridge element for introducing pressure onto separate regions of the substrate surface. The bridge element is preferably configured as a plastic molding having a surface which faces the cushion element and from which a multiplicity of pressure fingers extend towards the substrate surface.

By means of a pressure device of this type, the substrate is pressed onto a cooling component and the heat transfer between the substrate and the cooling component is thus established permanently and reliably. In this case, the elastic cushion element maintains constant pressure conditions under different thermal loads and over the entire life cycle of the power semiconductor module.

German Published Patent Application DE 10 2004 025 609 A1 discloses a power semiconductor module comprising a baseplate and auxiliary connection elements embodied as contact springs. In accordance with this document, a cover applies pressure to the contact springs for reliable electrical contact-connection. In this case, the contact springs are arranged in a mount in the housing, although the mount is not shown or described in detail.

German Published Patent Application DE 10 2006 006 421 A1 discloses a power semiconductor module having at least one connection element embodied as a contact spring. The module comprises a first contact device, a resilient section and a second contact device. In this case, a first plastic molding has a shaft arranged perpendicular to the substrate for receiving a connection element. The shaft has, for its part, a lateral cutout for the rotationally secure arrangement of the connection element and a recess for an assigned partial body of a second plastic molding, wherein the partial body likewise has a lateral cutout and, on the side remote from the substrate, a cutout through which the first contact device of the connection element extends.

German Published Patent Application DE 10 2006 058 692 A1 likewise discloses a power semiconductor module with contact springs having an S-shaped deformation in the region of the lower contact device. In accordance with this document, the deformation serves to afford protection against the contact spring falling out. The deformation of the contact spring is positioned between the substrate and the cutouts of the housing.

German Published Patent Application DE 10 2005 024 900 A1 likewise discloses a contact spring secured against falling out. In accordance with this document, the contact spring is held in the housing by the lower turns of the spring, which have a larger diameter than the upper turns of the spring, and thus ensures protection against the spring falling out of the housing.

What is disadvantageous about the prior art here is a technologically dictated excessively large projection of the auxiliary contact spring beyond the housing in the unmounted state and without arrangement of the control circuit board. The pressure contact spring projects beyond the housing at most by its entire spring excursion, which increases the risk of damage in the form of deformation of the spring head, that is to say of the upper contact device of the auxiliary connection. The spring impact area or the contact area on the mountable control circuit board has to be made large enough to ensure, under all circumstances, a reliable electrical contact-connection of the power semiconductor module to the mountable control circuit board.

SUMMARY OF THE INVENTION

It is therefore an object of the present invention to provide a power semiconductor module comprising pressure spring contacts, wherein the projection of the upper contact device is reduced and therefore so, too, is the risk of deformation of the contacts.

The inventive power semiconductor module includes at least one connection element in the form of a contact spring.

The inventive power semiconductor module furthermore includes a housing, a pressure member, and a substrate comprising at least one contact area.

The contact spring has a first contact device, a resilient section and a second contact device. The first contact device is preferably embodied in pin-like fashion or in the shape of an arc of a circle and is electrically conductively connected to a contact area of the substrate.

The second contact device of the contact spring has an arcuate or semicircle-like form, at the beginning and end of which a respective deformation is arranged. The deformations at the beginning and end of the second contact device are preferably V-shaped. The pressure member has at least two stop elements per connection element for the arrangement thereof. The stop elements of the pressure member apply pressure to the deformations of the second contact device of the contact spring, whereby the contact spring is prestressed via the resilient section. The prestress of the contact spring, after the arrangement of the pressure member, exerts a reliable and constant electrical contact-connection of the first contact device to the assigned contact area of the substrate of the power semiconductor module.

The prestress of the contact spring reduces the projection beyond the pressure member and thus reduces the risk of deformation of the spring. The contact-reliable arrangement of a control circuit board is additionally made possible.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The inventive solution is explained in further detail on the basis of the exemplary embodiments shown in FIGS. 1 to 4.

FIG. 1b is a detail of the cross-section by FIG. 1a;

FIG. 2b is a detail of the cross-section of FIG. 2a;

FIG. 3b is a detail of the cross-section of FIG. 3a; and

DETAILED DESCRIPTION OF THE PRESENTLY PREFERRED EMBODIMENTS

Figure 1A:
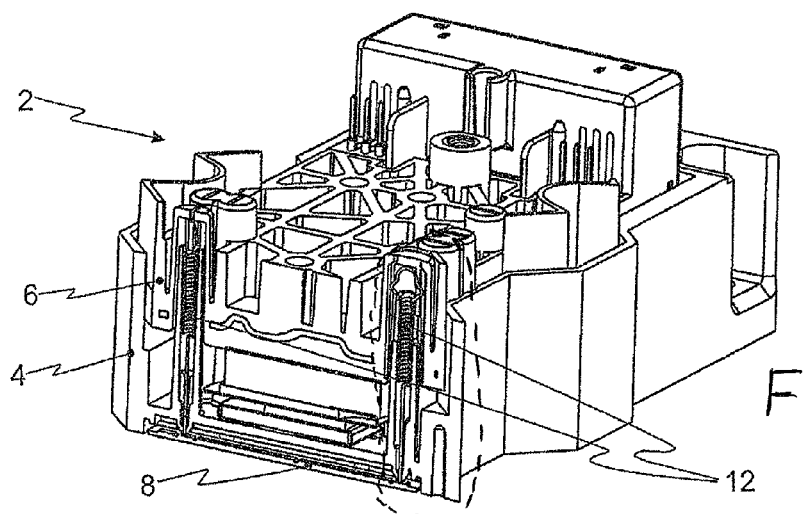
FIG. 1a is a cross-section through a power semiconductor module according to the invention before the positioning of the pressure member.
Figure 1B:
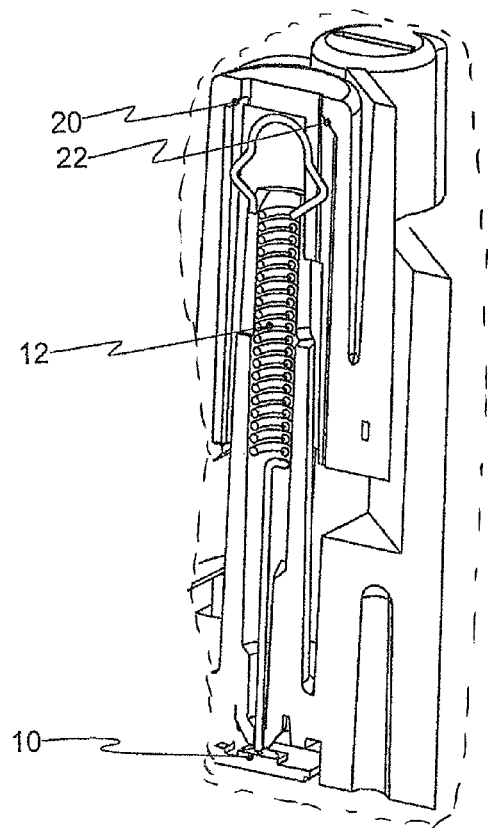

FIG. 1 is a cross-section through a power semiconductor module 2 according to the invention before the positioning of a pressure member 6 therein. In this case, the contact springs 12 (shown in detail in FIG. 1b) are arranged in movable fashion in shafts within a housing 4. Pressure member 6 is illustrated here with stop elements 20, 22. Power semiconductor module 2 likewise has a substrate 8 having contact areas 10. Contact areas 10 on substrate 8 provide electrical contact-connection of substrate 8 via contact springs 12 to control circuit boards 28 (FIG. 3) that can be mounted on power semiconductor module 2.

Figure 2A:
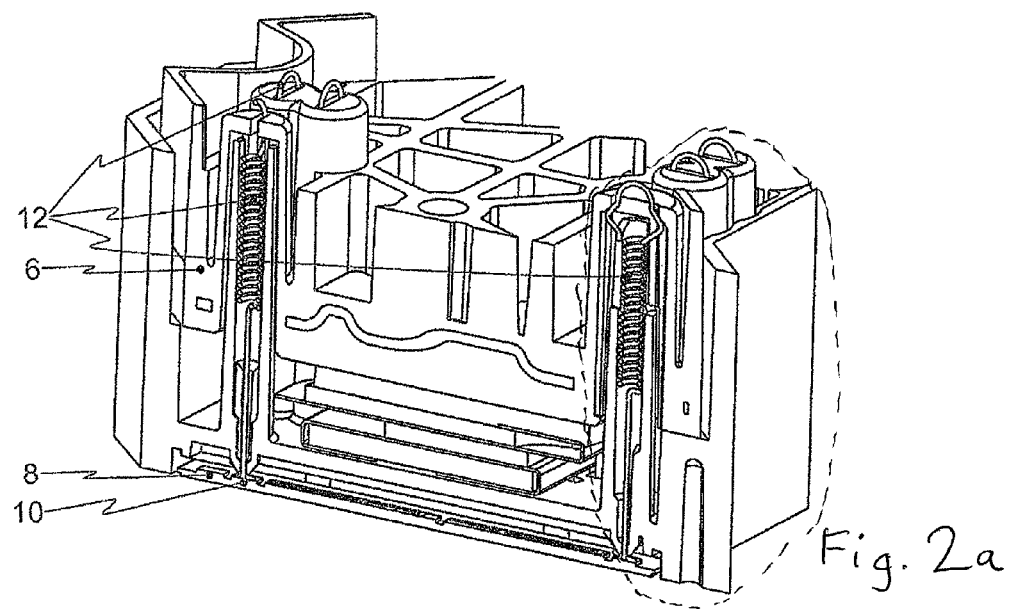
FIG. 2a is a cross-section through the power semiconductor module in accordance with FIG. 1 with the pressure member having been positioned.
Figure 2B:
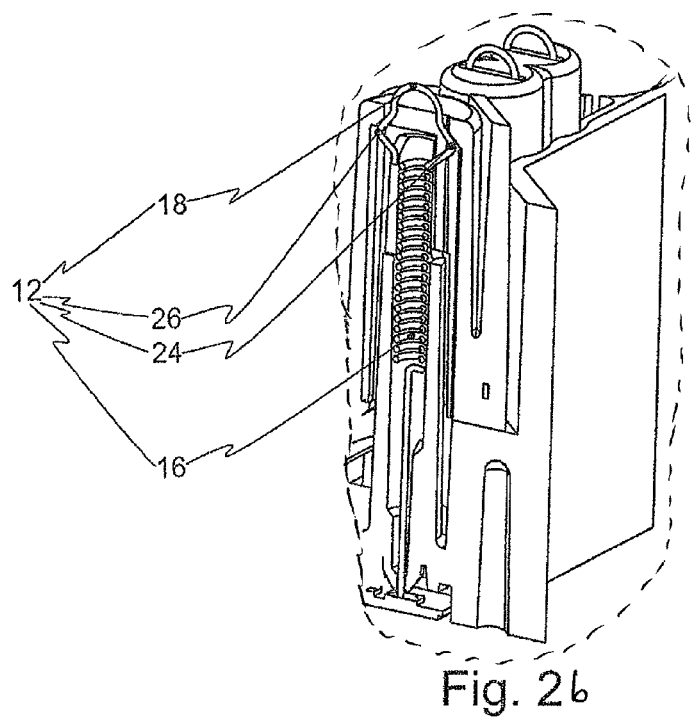

FIG. 2 is a cross-section through power semiconductor module 2 with pressure member 6 in place. As a result of the insertion of pressure member 6 pressure is applied to V-shaped deformations 24, 26 of a second contact device 18 of contact spring 12 by means of stop elements 20, 22 of pressure member 6a Deformations 24-26 thereby prestress contact spring 12. As a result of the prestress of contact spring 12, first contact device 14 (FIG. 4) of contact spring 12 is electrically conductively connected to contact areas 10 of substrate 8 in a reliable and constant fashion. The prestress of contact spring 12 likewise reduces the projection of second contact device 18 beyond pressure member 6 and thus reduces the risk of a deformation of the second contact device 18 of contact spring 12.

Figure 3A:
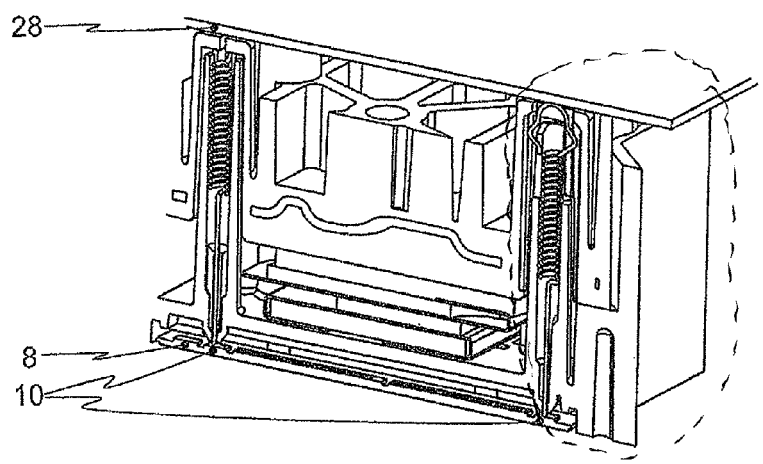
FIG. 3a is a cross-section through the power semiconductor module in accordance with FIG. 1 with the control circuit board having been arranged.
Figure 3B:
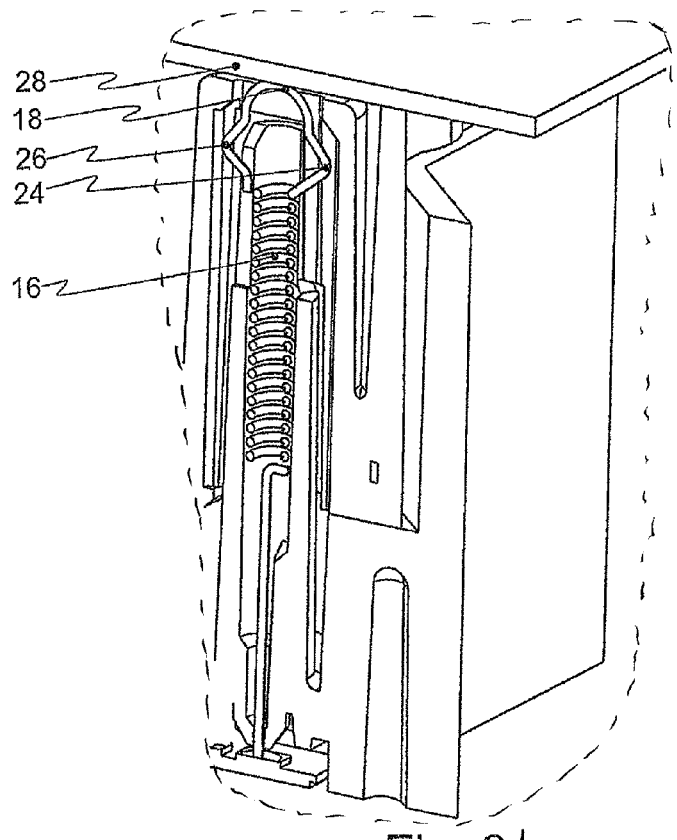

FIG. 3 is a cross-section through power semiconductor module 2 with a control circuit board 28 having been arranged therein. Pressure is applied here to second contact device 18 of contact spring 12 by control circuit board 28 and second contact device 18 is compressed by the projection of second contact device 18 beyond pressure member 6. Contact spring 12, establishes a reliable electrical contact-connection between the contact areas of control circuit board 28 and contact areas 10 on substrate 8. In this case, pressure is no longer applied to V-shaped deformations 24, 26 of second contact device 18 by stop elements 20, 22 of positioned pressure member 6, whereby the reliable electrical contact-connection of the contact areas of control circuit board 28 and second contact device 18 of contact spring 12 is no longer guaranteed by the prestress with the deformations 24, 26 to which pressure is applied by stop elements 20, 24.

Figure 4:
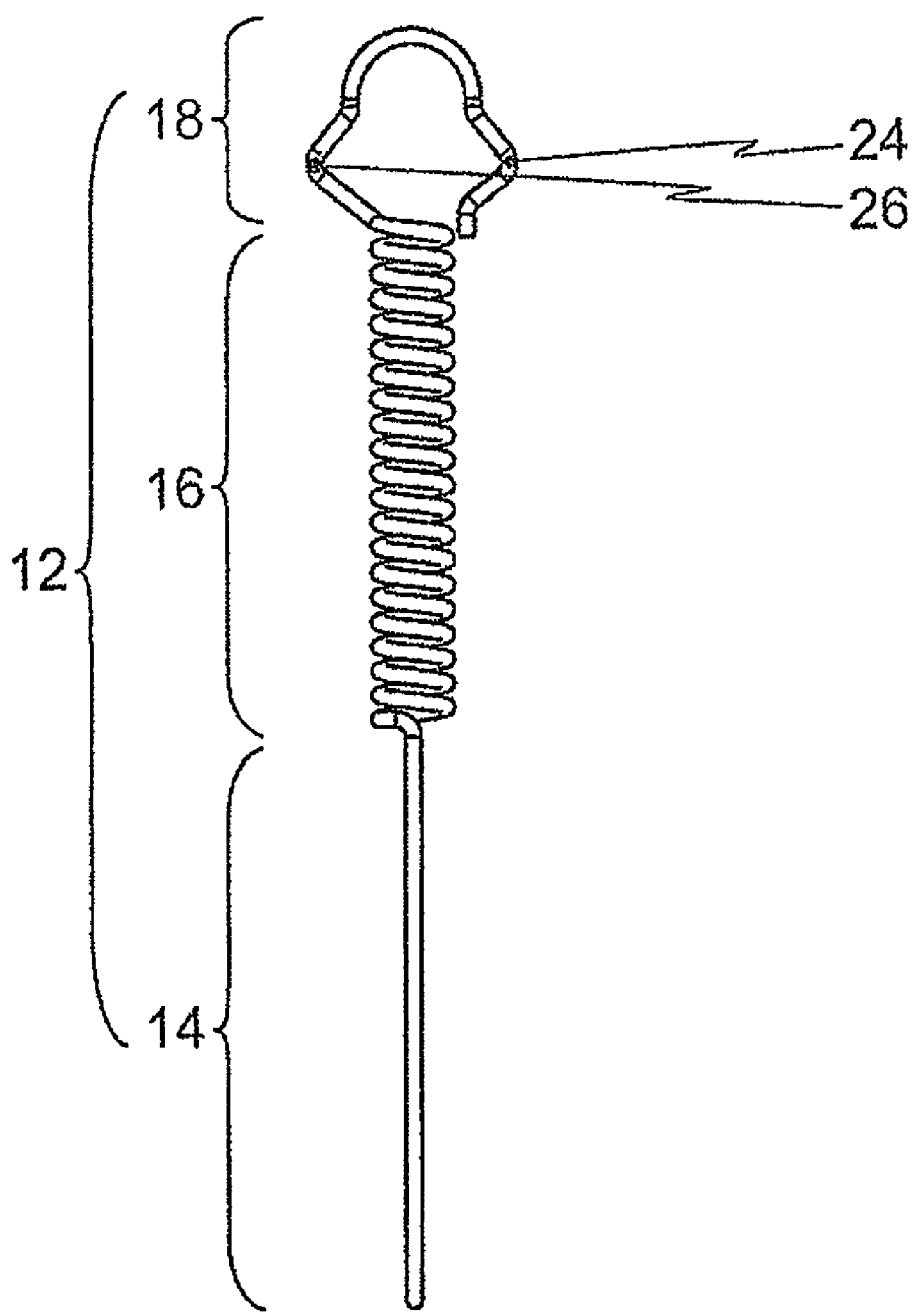
FIG. 4 shows the construction of a contact spring in accordance with the invention.

FIG. 4 shows the construction of a contact spring 12 comprising a first contact device 14, a resilient section 16 and a second contact device 18. The first contact device 14 is formed in pin-like fashion, or in the form of an arc of a circle (not illustrated here). The second contact device 18 has an arcuate or semicircular section for making contact with the control circuit board 28. Respective V-shaped deformations 24, 26 are arranged at the end and at the beginning of the semicircular section, wherein one of the V-shaped deformations 24, 26 is connected to resilient section 16. The vertex points of the two V-shaped depressions 24, 26 extend away from the longitudinal axis of the spring 12 and are situated opposite one another.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a housing having an exterior;
   a pressure member;
   a substrate having at least one contact surface; and
   at least one connection element extending towards the exterior of said housing;
   wherein said connection element includes a contact spring having a first contact device, a resilient section and a second contact device;
   wherein said pressure member includes at least two stop elements for each connection element;
   wherein said first contact device of said contact spring is electrically conductively connected to said contact surfaces of said substrate;
   wherein said second contact device of said contact spring is arcuate in shape, and has a beginning and an end;
   wherein at least one deformation is formed at the beginning and at the end of said arcuate second contact device; and
   wherein said at least one deformation of said second contact device co-operates with said stop elements of said pressure member, thereby prestressing said contact spring when in use.

2. The power semiconductor module of claim 1,
   wherein said deformations of said second contact device of said contact spring are substantially V-shaped;

wherein the V-shaped deformations have vertices which extend away from a longitudinal axis of said connection element;
wherein said deformations are positioned opposite one another; and
wherein at least one of said deformations is connected to said resilient section of said contact spring.

3. The power semiconductor module of claim 1, wherein said first contact device is shaped substantially like one of a pin and a semicircle.

* * * * *